United States Patent
Eccleston

(10) Patent No.: US 6,818,486 B2
(45) Date of Patent: Nov. 16, 2004

(54) METHOD OF ELECTRONIC COMPONENT FABRICATION AND AN ELECTRONIC COMPONENT

(75) Inventor: William Eccleston, Merseyside (GB)

(73) Assignee: The University of Liverpool, Liverpool (GB)

(*) Notice: Subject to any disclaimer, the term of this patent is extended or adjusted under 35 U.S.C. 154(b) by 0 days.

(21) Appl. No.: 10/297,284

(22) PCT Filed: Jun. 4, 2001

(86) PCT No.: PCT/GB01/02456

§ 371 (c)(1),
(2), (4) Date: Mar. 31, 2003

(87) PCT Pub. No.: WO01/95384

PCT Pub. Date: Dec. 13, 2001

(65) Prior Publication Data

US 2003/0170937 A1 Sep. 11, 2003

(30) Foreign Application Priority Data

Jun. 3, 2000 (GB) .............................. 0013473

(51) Int. Cl.⁷ .............................................. H01L 21/00
(52) U.S. Cl. ...................................... 438/151; 438/158
(58) Field of Search ................................ 438/149–167, 438/FOR 201, FOR 184; 257/E51.005, E29.151, E29.273; 345/92

(56) References Cited

U.S. PATENT DOCUMENTS

| | | | | |
|---|---|---|---|---|
| 3,813,762 A | * | 6/1974 | Kniepkamp | 438/570 |
| 4,404,731 A | * | 9/1983 | Poleshuk | 438/158 |
| 5,585,655 A | * | 12/1996 | Ota et al. | 257/282 |
| 5,641,380 A | * | 6/1997 | Yamazaki et al. | 438/304 |
| 5,981,970 A | * | 11/1999 | Dimitrakopoulos et al. | 257/40 |
| 2002/0072618 A1 | * | 6/2002 | Afzali-Ardakani et al. | 549/6 |

FOREIGN PATENT DOCUMENTS

JP 05190856 7/1993

* cited by examiner

Primary Examiner—George Fourson
Assistant Examiner—Brook Kebede
(74) Attorney, Agent, or Firm—Blakely, Sokoloff, Taylor & Zafman; Stephen M. De Klerk

(57) ABSTRACT

A method of fabricating an electronic component is disclosed in which an electrically conductive layer (4) is provided upon a substrate (2). A mask (6) having a window (8) is provided upon the layer and by etching, preferably chemically, through the window an opening (10) the conductive layer. Conductive material is deposited, preferably by vapor deposition, through the window to form an island in the opening. The etching of the conductive layer is carried out such that the conductive layer is undercut at the periphery of the window with the result that the periphery of the island is spaced apart from the periphery of the opening. Also disclosed is a thin film transistor structure well suited to fabrication by the above described method.

11 Claims, 1 Drawing Sheet

METHOD OF ELECTRONIC COMPONENT FABRICATION AND AN ELECTRONIC COMPONENT

CROSS-REFERENCE TO OTHER APPLICATIONS

This Application is a National Phase of International Application No. PCT/GB01/02456, filed on Jun. 4, 2001, which claims priority from Great Britain Patent Application No. 0013473.4, filed on Jun. 3, 2000.

FIELD

The present invention is concerned with a method of fabrication of an electronic component, and with an electronic component as such. The invention is in particular (although not exclusively) applicable to transistor fabrication, and still more particularly to fabrication of thin film transistors.

BACKGROUND

Considerable research effort has been devoted in recent years to thin film transistors (TFTs), and particularly to TFTs utilizing bodies formed by thin films of semiconductor polymer. The TFTs so far proposed in the literature have been inverted horizontal structures. The gate is in most cases single crystal silicon which has been oxidized to produce a thin reliable oxide layer using a well defined technology, already available from work on silicon integrated circuits. An example of such a transistor is illustrated in schematic vertical section in FIG. 1, having a source 102 horizontally separated from a drain 104, both being formed above a gate 106 of silicon having an oxide layer 108 by which the gate is separated from the source and drain. The semiconductor body 110 is of polymer material.

A problem with the known horizontal TFT structures is that they have very large overlaps of the gate by the drain and source, as FIG. 1 clearly shows. In a typical inverter circuit, as used in digital applications, the drain voltage of the driver transistor is out of phase with that of the gate. This essentially doubles the magnitude of the voltage swing between these terminals. The same effect occurs with many devices used in this configuration. It is called the Miller Effect and essentially doubles the effective overlap capacitance. The gate channel capacitance is one unit of capacitance, the source is a second and the drain is two units, making a total of four. Without the overlap capacitances there would be only one unit of capacitance, and a circuit utilizing the transistor could go four times faster.

The silicon dioxide gate of the known TFT has a dielectric constant of 3.9. The amount of charge induced in the channel is proportional to this number. The gain obtained due to the gate's dielectric constant is countered by the Miller capacitance which makes the gate more difficult to drive. These effects exactly cancel.

There is, however, a benefit in use of a high dielectric constant material to isolate the gate, since it can allow a reduction in the threshold voltage of the transistor. The threshold voltage is the gate voltage required to turn on a channel. It is non-zero due to the undesirable effects of fixed charge in the oxide and any work function difference across the dielectric due to the materials used. These may serve to reduce threshold voltage for some kinds of devices.

There is a third effect, due to interface trapping levels, which always increases threshold voltage. This effect is very important in polymers so that there is great benefit in having a high gate dielectric constant.

Dielectric constant can vary from 1 to several hundred, but for most materials suitable for use in TFTs it is typically in the range 3 to 25. These are most likely to be the oxides of metals.

A major application of thin film polymer transistors is in flat panel displays. They are required to be very large in area so that the use of silicon is usually not feasible, and even if large area silicon were available the cost would be prohibitive. For most display applications the substrate material has to be transparent, making glass or plastic the favoured choice. There is therefore a need to limit the temperatures involved in manufacture to be compatible with such substrates. It is desirable that these temperatures should not be substantially greater than 200 C.

Efforts to reduce Miller capacitance have been limited by the dimensional tolerances in the processes used to fabricate horizontal component structures. In the known TFT, the gate and the source/drain are formed as successive layers using photolithographic techniques involving correspondingly formed resist layers, a first layer being used to form the gate and a further layer to form the source/drain. The accuracy of the relative lateral positioning of the gate and the source/drain is thus limited by tolerances in the formation of the resist layers themselves.

Hence a first object of the present invention is to make possible a method of electronic component fabrication having improved relative lateral positioning of two or more parts of the component.

The improvement is not only desirable in transistor manufacture but offers particular benefits in this area.

An additional or alternative object of the present invention is to make possible a transistor having reduced overlap capacitance.

An additional or alternative object of the present invention is to make possible a transistor having a high gate dielectric constant and particularly a gate dielectric constant higher than that of silicon dioxide. It is particularly desired to enable such a transistor to be fabricated without use of excessive temperatures.

It is further desired to achieve one or more of the above objects using a polymer based transistor, most preferably a thin film transistor.

SUMMARY

In accordance with a first aspect of the present invention there is a method of electronic component fabrication comprising providing an electrically conductive layer upon a substrate; providing a mask over the electrically conductive layer, the mask having at least one window; etching the conductive layer through the window to form an opening in the conductive layer, and depositing conductive material through the window to form an island in the opening, the etching being carried out such that the conductive layer is undercut at the periphery of the window so that the periphery of the island is spaced apart from the periphery of the opening.

By using the same mask window in forming the opening in the conductive layer and the island it becomes possible to determine the relative positioning of these two items with greatly improved accuracy not limited by the tolerance involved in manufacture of the mask itself. The undercutting of the conductive layer, which may for example result from use of a chemical etching process, is typically regarded as a problematic phenomenon, but is used to advantage in the method according to the present invention and makes it possible to ensure that despite being formed using a common mask the items are separated spatially - and if necessary also isolated electronically. Requiring only a single mask for fabrication of two or more parts, the fabrication process according to the present invention is straightforward. Where the process is applied to transistor manufacture the island may form a transistor gate while separate portions of the conductive layer form the transistor source and drain. Gate isolation is, in a particularly preferred method according to the present invention, provided for by selectively anodising the gate.

A metal gate is particularly preferred. Aluminum is a suitable material. The fabrication process can be carried out without excessively high temperatures and the resulting dielectric (metal oxide) layer can have the desired high dielectric constant.

Formation of the island is, in an especially preferred method according to the present invention, carried out by metal evaporation. The process can form an island whose periphery closely matches the periphery of the window.

In a particularly preferred method according to the present invention the transistor body is formed by introducing semiconductor material into the space between the island and the conductive layer. It is particularly preferred that the semiconductor materials comprises a polymer material. A suitable material is regio-regular polyalkylthiophene, although other polythiophenes are also suitable.

It is to be understood that the term "polymer" as used herein includes, as well as longer chain polymers, the relatively short chain oligomers.

In accordance with a second aspect of the present invention there is a transistor comprising a source and a drain both substantially co-planar with and laterally separated from a gate, and a body comprising semiconductor material disposed between the source/drain and the gate.

The source/drain and the gate may be co-planar in the sense that they are formed upon a common substrate.

It is especially preferred that the source/drain and the gate are formed using a common mask having a window, one being formed by etching through the window such as to undercut at the window periphery and the other being formed by deposition of material through the window.

The gate may be insulated from the body by a dielectric layer formed thereupon by selective anodisation

BRIEF DESCRIPTION OF THE DRAWINGS

Specific embodiments of the present invention will now be described, by way of example only, with reference to the accompanying drawings in which: vertical

FIG. 6 illustrates the completed transistor.

DETAILED DESCRIPTION

Figure 1:
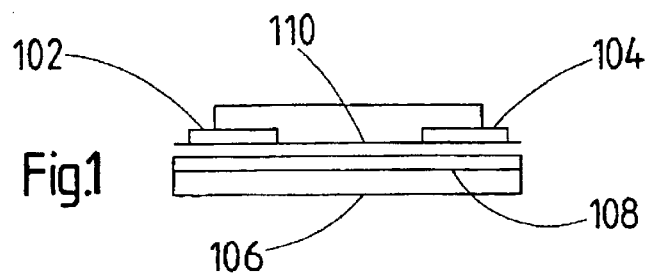
FIG. 1 is a schematic vertical section through a conventional horizontal thin film transistor.
Figure 2:
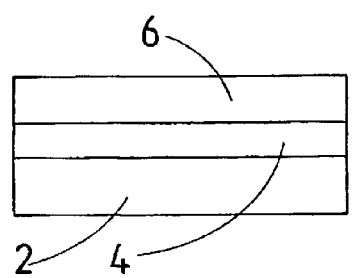
FIGS. 2, 3, 4, 5, 6, and 7 are schematic vertical sections through successive stages in the production of a thin film transistor structure embodying the present invention.

The illustrated exemplary transistor embodying the present invention is formed on a substrate 2 of glass, although a plastics substrate—or indeed a substrate of some other material may be used in other embodiments. At an early stage in the fabrication process (FIG. 2) a metal layer 4 is vacuum deposited upon the substrate and a photoresist layer 6 is spun upon the surface of the metal layer 4.

Figure 3:
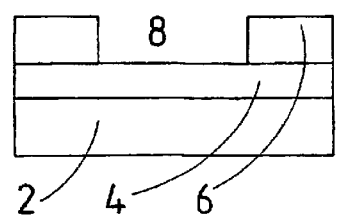

Subsequently a window is formed in the photoresist layer 6. In FIG. 3 this window is seen to take the form of an aperture 8 through the photoresist layer 6. The photoresist layer is thus adapted to serve as a mask for subsequent operations. The aperture 8 may be formed by conventional photolithography.

Figure 4:
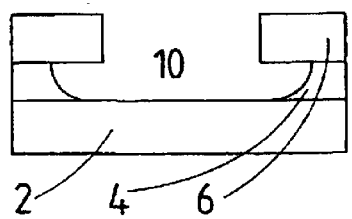

The metal layer 4 is then etched away chemically in the region determined by the aperture 8. It is important to note that the metal layer 4 is undercut around the periphery of the aperture 8 since the etch moves along the interface as well as downward through the metal. This type of undercutting is in itself known and understood. Those skilled in the art refer to the "etch factor" which is the allowance to be made in mask design for undercutting of the etched material. The result of the undercutting is that an opening 10 formed through the metal has somewhat larger horizontal extent than the mask aperture 8 used in its formation and that the etched metal edges have a concave curvature as FIG. 4 illustrates.

Figure 5:
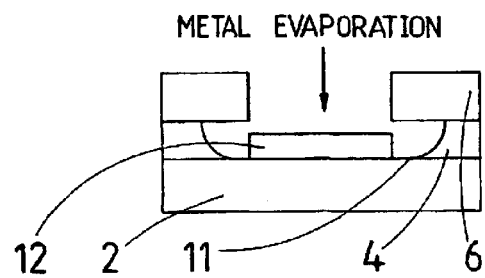

Metal is subsequently vacuum evaporated over the whole plate, reaching the glass substrate 2 only in the region of the aperture 8. In this way a metal island 12 is formed upon the substrate 2, within the opening 10, the island's horizontal extent more accurately matching that of the aperture 8 (see FIG. 5).

Figure 6:
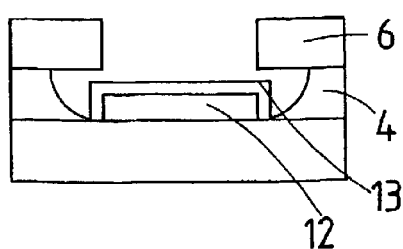

Due to the undercutting of the metal layer 4, there is a horizontal space 11 between this and the metal island 12. Because these parts are formed using the same mask aperture their relative positions are very accurately determined and the spacing can be kept to a minimum. Nonetheless, this spacing ensures that the metal layer 4 and island 12 are electrically isolated, making it possible to anodise the metal body 12 preferentially, e.g. by plasma or aqueous anodisation. This requires an electrical connection to the metal island 12 which may be formed using elongate metal stripes leading to the edge of the substrate 2. The result of the anodising process is seen in FIG. 6, the metal island 12 bearing on its exposed faces a dielectric layer 13 of anodised metal. Aluminum is a suitable metal for the island 12.

Figure 7:
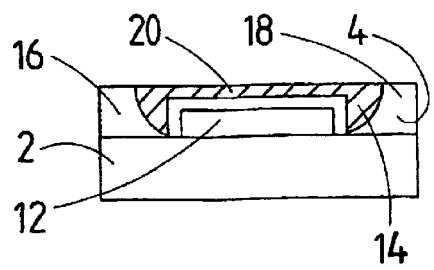

In FIG. 7. the resist layer 6 has been removed and conjugated semiconductor polymer material 14 has been cast across the surface, filling the void in the metal layer 4. Suitable semiconductor polymers are known to those skilled in the art. Regioregular polyalkylthiophene is used in the present embodiment. The components of the transistor have now been formed. Source 16 and drain 18 are formed by portions of the metal layer 4; the gale is formed by the metal island 12 and is isolated from the semiconductor body, formed by the polymer material 14, by its anodised layer 13. This layer has, due to its material, the required high dielectric constant. The length of the transistor channel 18 is almost exactly equal to the dimension of the aperture 8 which was formed in the resist and can be made equal to the minimum feature size. Overlap of the source/drain with the gate is minimal.

What is claimed is:

1. A method of transistor fabrication comprising providing an electrically conductive layer upon a substrate; providing a mask over the electrically conductive layer, the mask having at least one window; etching the electrically conductive layer through the window to form an opening in the electrically conductive layer and to define portions of the electrically conductive layer forming source and drain of the transistor; and depositing conductive material through the window to form a metallic transistor gate in the opening, the etching being carried out such as to cause undercutting at the periphery of the window so that the opening has a larger extent, in the direction parallel to the surface of the substrate, than the window, and the deposition of conductive material being carried out by metal evaporation such that the periphery of the metallic transistor gate corresponds to the periphery of the opening, so that the periphery of the metallic transistor gate is spaced apart from the source and drain; oxidizing the metallic transistor gate to form a dielectric layer; and introducing semiconductor material between the source and drain, upon the metallic transistor gate and in the spaces between the source/drain and the metallic transistor gate, to form the transistor's semiconductor body.

2. A method of transistor fabrication as claimed in claim 1, wherein chemical etching is used in forming the opening in the electrically conductive layer.

3. A method of transistor fabrication as claimed in claim 1 wherein the semiconductor body is formed by casting.

4. A method of transistor fabrication as claimed in claim 3 wherein the semiconductor material is a polymer material.

5. A method of transistor fabrication as claimed in claim 3 wherein the semiconductor material is a polythiophene.

6. A method of transistor fabrication as claimed in claim 3 wherein the semiconductor material is regioregular polyalkylthiophene.

7. A method of transistor fabrication as claimed in claim 1 wherein isolation of the metallic transistor gate isolation is provided by anodizing the gate.

8. A method of transistor fabrication as claimed in claim 1 wherein the metallic transistor gate comprises aluminum.

9. A method of transistor fabrication as claimed in claim 1 wherein the substrate is transparent.

10. A thin film transistor comprising a substrate, a conductive metallic gate disposed upon the substrate and having a metal oxide dielectric layer, a source and a drain disposed upon the substrate, the source and the drain being laterally separated from the gate and having edges whose shape is characteristic of undercut etching, and a semiconductive polymer transistor body which is disposed in a region between the source and the drain, upon the gate and in regions between the source/gate and the drain, the gate dielectric layer serving to isolate the gate from the source and the drain.

11. A thin film transistor as claimed in claim 10 wherein the semiconductor material comprises a polythiophene.

* * * * *